United States Patent
Oila

(10) Patent No.: US 8,322,034 B2
(45) Date of Patent: Dec. 4, 2012

(54) APPARATUS AND METHOD FOR THE INSERTION AND WITHDRAWAL OF PLUG-IN MODULES

(75) Inventor: Kari Oila, Zurich (CH)

(73) Assignee: Elma Electronics AG, Wetzikon (CH)

( * ) Notice: Subject to any disclaimer, the term of this patent is extended or adjusted under 35 U.S.C. 154(b) by 0 days.

(21) Appl. No.: 12/203,298

(22) Filed: Sep. 3, 2008

(65) Prior Publication Data

US 2009/0000117 A1    Jan. 1, 2009

Related U.S. Application Data

(62) Division of application No. 11/594,498, filed on Nov. 7, 2006, now Pat. No. 7,442,059.

(30) Foreign Application Priority Data

Nov. 11, 2005 (EP) .................................... 05405629

(51) Int. Cl.
*H01R 43/20* (2006.01)

(52) U.S. Cl. ................ 29/876; 29/831; 29/747; 29/764; 439/157; 439/52; 361/679.01; 361/732

(58) Field of Classification Search .................... 29/831, 29/832, 747, 876, 750, 758, 764; 439/157, 439/159, 160, 188, 52, 53, 59, 62, 76.1, 78; 361/679.01, 732, 752, 754, 758, 759, 760, 361/769

See application file for complete search history.

(56) References Cited

U.S. PATENT DOCUMENTS

| 4,223,934 A * | 9/1980 | Cauceglia et al. ............... 294/15 |
| 4,917,618 A * | 4/1990 | Behrens et al. ................ 439/157 |
| 5,373,133 A * | 12/1994 | Brockway et al. ............ 200/335 |
| 5,398,167 A * | 3/1995 | Joist et al. ...................... 361/801 |
| 6,552,915 B2 * | 4/2003 | Takahashi et al. ............. 361/796 |
| 7,284,997 B2 * | 10/2007 | Joist ............................... 439/157 |
| 2002/0048978 A1 * | 4/2002 | Hahn et al. ..................... 439/157 |
| 2004/0106318 A1 | 6/2004 | Westphall et al. |
| 2004/0192095 A1 * | 9/2004 | Joist .............................. 439/188 |

FOREIGN PATENT DOCUMENTS

| DE | 20311072 U1 | 9/2003 |
| JP | 01-164098 A | 6/1989 |
| JP | 04-003996 A | 1/1992 |

* cited by examiner

*Primary Examiner* — A. Dexter Tugbang
*Assistant Examiner* — Jeffrey T Carley
(74) *Attorney, Agent, or Firm* — Kilpatrick Townsend & Stockton LLP

(57) ABSTRACT

An apparatus for the insertion and withdrawal of a plug-in module with front panel into and out of a module carrier includes a lever arm (2) pivotable about an axis (3) with a handle portion (2*a*) for the rotation of the lever arm as well as a bolt (5) to lock the lever arm and an operating element (5*a*) connected to the bolt with which the lever arm can be unlocked. The operating element (5*a*) is arranged spaced from the lever arm (2), and the handle portion (2*a*) is designed such that it contacts the front panel (10) of the plug-in module in the inwardly pivoted position.

12 Claims, 2 Drawing Sheets

APPARATUS AND METHOD FOR THE INSERTION AND WITHDRAWAL OF PLUG-IN MODULES

CROSS-REFERENCE TO RELATED APPLICATIONS

This application is a divisional of U.S. application Ser. No. 11/594,498, filed Nov. 7, 2006, now U.S. Pat. No. 7,442,059 and which claims the benefit of European Patent Application No. 05405629.6, filed Nov. 11, 2005, the disclosures of which are both incorporated herein by reference.

BACKGROUND OF THE INVENTION

The invention relates to an apparatus for the insertion and withdrawal of a plug-in module with a front panel into or out of a module carrier, to a plug-in module with such an apparatus and to a module carrier with such a plug-in module as well as to a method for the insertion and withdrawal of a plug-in module with front panel.

Plug-in modules introducible into module carriers have multiple plug connections at the rear side for which plug-in and removal forces have to be overcome on the insertion or withdrawal of the plug-in module. Plug-in modules are therefore usually provided with one or more apparatuses, for example a respective apparatus in a lower area and an upper area of the front side, in order to facilitate the insertion and the removal. The apparatuses each include a lever arm which is pivotally arranged and resting against a front side section of the module carrier such that the insertion and withdrawal are facilitated through the effect of the lever arm. The apparatuses each further include a locking device to lock and/or to secure the lever arm in an inwardly pivoted state as well as, if necessary, a switching element actuatable by means of a lever arm or locking device in order to switch off the power or switch the plug-in module into a passive mode before withdrawal.

A plug-in module with a front panel is known from document DE 203 11 072 U1 in which a blocking lever is hinged to a lever pulling handle that includes a latching catch, in order to secure the lever pulling handle in the inwardly pivoted position. The latching catch is operationally connected to a switch attached to the circuit board of the plug-in module, so that the plug-in module can be switched into a current-free state on actuation of the blocking lever. A drawback of this plug-in module is the close arrangement of the handle portions of the lever pulling handle and of the blocking lever directly next to one another, which makes it possible to actuate both handle portions practically simultaneously. This leads to a situation in which the time gap between the activation of the switch and the separation of the rear side plug connections through removal of the plug-in module is very short through quick rotation of the lever pulling handle, for example shorter than 100 ms, and in which the plug-in module is pulled out before it is in a passive state. Depending on the usage of the plug-in module, the electrical contacts of the plug-in modules at the rear side, and/or the electrical circuit of the plug-in module or of associated parts of the system, can be damaged. A further disadvantage of the above-described plug-in module exists in that the close arrangement of the handle parts of the lever pulling handle and of the blocking lever directly alongside one another encourages the outward pivoting of the lever pulling handle before the latching catch is completely released. This can lead to premature wear of the latching catch.

SUMMARY OF THE INVENTION

An object of the present invention is to provide an apparatus for the insertion and removal of a plug-in module with front panel into, or respectively out of, a module carrier, a plug-in module with such an apparatus and a module carrier with such a plug-in module as well as a method for the insertion and withdrawal of a plug-in module with front panel, which avoids the above-described disadvantages of the prior art.

The apparatus for the insertion and withdrawal of a plug-in module with front panel into and out of a module carrier in accordance with the invention includes a lever arm pivotable about an axis with a handle portion for the pivoting of the lever arm as well as a locking element for the locking of the lever arm in an inwardly pivoted state and an operating element for the unlocking of the same, the operating element being, for example, connected to the locking element and with it being possible to unlock the lever arm by means of the operating element. In the apparatus of the invention, the actuating element is arranged spaced from the lever arm, with the handle portion being designed such that it contacts the front panel of the plug-in module in an inwardly pivoted state.

In a preferred embodiment, the lever arm is pivotable into an intermediate position after the unlocking, and is preferably automatically pivotable into an intermediate position.

In a further preferred embodiment, the apparatus includes a holding part, for example for the holding of the locking element and/or of the actuation element, and, in a further preferred embodiment, a switching element for an active/passive switching and/or switching the plug-in module to a current-free state, the switching element being actuatable by means of the locking element and/or of the operating element, and being advantageously secured to the holding part. In a preferred variation a centering pin for the centering of the plug-in module is provided at the holding part.

In a further preferred variant, the locking element is formed to lock automatically, in order to secure the lever arm in an inwardly pivoted position, for example in that the locking element is operatively connected to a return spring.

The invention further includes a method for the insertion and withdrawal of a plug-in module with front panel into and out of a module carrier by means of an apparatus, which includes a pivotable lever arm with lock. For the withdrawal of the plug-in module the inwardly pivoted and locked lever arm is unlocked by means of an operating element, which is arranged spaced from the lever arm. The unlocked lever arm pivots outwards automatically into an intermediate position, whereby the plug-in module is pulled out. For the insertion of the plug-in module, the lever arm is pivoted inwardly by the handle portion until the handle portion contacts on the front panel. The inwardly rotated lever arm locks automatically.

In a preferred embodiment, the introduction of a finger between the handle portion and front panel is made more difficult or hindered through the design of the handle portion and/or the contact of the handle portion at the front panel.

In a further preferred embodiment a switching element is operated upon the locking and/or the unlocking of the lever arm.

The invention further includes a plug-in module with front panel which includes at least one of the above-described embodiments of an apparatus for the insertion and withdrawal of the plug-in module, and/or a plug-in module with front panel to implement the above-described method, and/or a module carrier with at least one such plug-in module.

The apparatus according to the invention and the method according to the invention for the insertion and withdrawal of a plug-in module with front panel have the advantage that the unlocking procedure is separated from the pulling-out procedure, since a simultaneous actuation of the operating element for the unlocking and of the handle portion for the outward pivoting of the lever arm is made more difficult or prevented entirely by the spaced arrangement of the actuation element and the design of the handle portion, which contacts the front panel in the inwardly pivoted state, or is countersunk. This is valid particularly for plug-in modules, which are each designed with one apparatus in each of a lower area and an upper area of the front side, and which can only be pulled out when the lever arms of the lower and upper apparatus are simultaneously pivoted outwardly. I.e. a service person must operate one apparatus with each of the left and right hands to pull out the plug-in module. Since the handle portions contact the front panel in the inwardly pivoted and locked position of the lever arm, a service person would be required to first unlock the lever arms, whereby these are automatically pivoted outwardly into an intermediate position. In the intermediate position, the handle portions of the lever arms may be subsequently comfortably grasped and outwardly pivoted. A grasping of the handle portions for the outward pivoting of the lever arms is made more difficult or prevented, so long as they find themselves in an inwardly pivoted state, by the contact of the handle portions on the front panel and a respective given form of the handle portions. Advantageously, such handle portions are designed so that the insertion of fingers between the handle portion and front panel is made difficult or prevented so long as the handle portion contacts the front panel. Due to the separation of the unlocking and withdrawal procedures, damage or wearing out of the locking device through outward pivoting of the lever arm before this is fully unlocked are largely avoided.

It is also advantageous that, on passive switching of the plug-in module, a minimal time interval between the actuation of the switching element upon unlocking and the separation of the plug connections at the rear side upon withdrawal of the plug-in module can be lengthened, due to the separation between the unlocking procedure and the withdrawal procedure.

The attachment of the switching element for active/passive switching of the plug-in module, i.e. switching it to a current-free state, to a holding part of the apparatus for insertion and withdrawal of the same is further advantageous, since in this case the switching element must not be separately attached and/or soldered to the circuit board of the plug-in module, but can rather be connected to the circuit board by means of connection cables, particularly connection cables with plug contacts. The connection is advantageously made via plug contacts to the component side of the circuit board. The soldering of the plug contacts to the circuit board can take place together with the soldering of the remaining components, so that the effort for the connection of the switching element is comparatively small.

The above description of embodiments of the apparatus according to the invention and of the methods according to the invention merely serves as an example. In addition, in the context of the present invention, individual features can also be combined together from the embodiments described or shown, to form new embodiments.

The invention will be explained in more detail in the following with reference to the embodiment and to the drawings.

DESCRIPTION OF THE PREFERRED EMBODIMENTS

Figure 1:
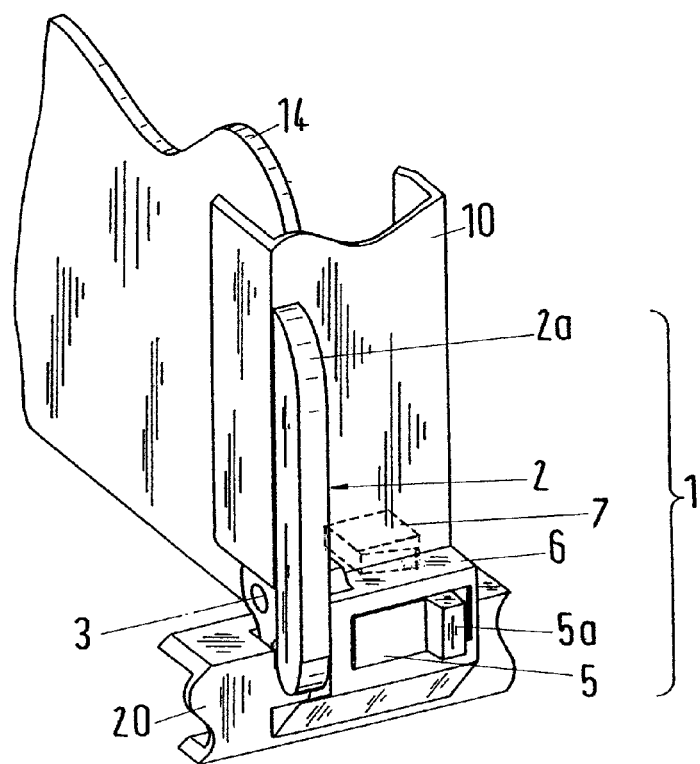
FIG. 1 is a perspective view of a section of a plug-in module with an embodiment of an apparatus for the insertion and withdrawal of the plug-in module according to the present invention with a lever arm in an inwardly pivoted state.

FIG. 1 shows a perspective view of a section of a plug-in module—with an embodiment of an apparatus for the insertion and withdrawal of the plug-in module according to the present invention—having a lever arm 2 in an inwardly pivoted state. The plug-in module shown includes, apart from apparatus 1 for the insertion and withdrawal, a front section 10, in the following simply called a front panel, and optionally a circuit board 14. The lever arm 2 of the apparatus is furnished with a handle portion 2a, by which means the lever arm can be pivoted about an axis 3. In the embodiment shown in FIG. 1, an area at the end of the lever arm, which is spaced far enough from the axis, e.g. by more than 1.5 cm, serves as a handle portion. Other forms of the handle portion are also possible, so long as it lies on the front panel in an inwardly pivoted state. By way of example, a shape other than that shown can be formed on or molded onto the lever arm, or a suitable handle portion can be slipped over the end of the lever arm. In a further variant the handle portion and the front panel are formed such that the handle portion is completely or partly countersunk into the front panel in the inwardly pivoted state of the lever arm.

The apparatus of the embodiment shown in FIG. 1 further includes a locking element 5, which can be formed as a simple locking bolt, which in the inwardly pivoted state of the lever arm engages into it, to lock and/or secure the lever arm. In a preferred embodiment the locking element 5 is pre-stressed, for example by means of a spring, so that it latches into or at the lever arm 2 and locks this automatically as soon as the lever arm finds itself in an inwardly pivoted position. The apparatus further includes an operating element 5a for the unlocking of the lever arm as well as, if required, a holding part 6 for the holding of the locking element 5. The operating element can, for example as shown in FIG. 1, be formed as a protruding nose on the locking element 5, and the locking element can be moveably guided in the holding part 6. In addition, the operating element 5a can be visually emphasized, for example by appropriate coloring.

FIG. 1 further shows a front section 20 of a module carrier, into which the plug-in module is inserted. The apparatus 1 for insertion and withdrawal of the plug-in module is arranged in the lower area of the front panel 10 of the plug-in module such that in the inwardly pivoted state of the associated lever arm 2 the front section 20 of the module carrier engages into a recess of the lever arm, so that the plug-in module cannot be withdrawn without outward pivoting of the same. The lever arm is locked by means of the locking element 5 in the inwardly pivoted state, wherein the plug-in module is secured against unintentional withdrawal or a loosening and sliding out under the influence of jolts or vibrations.

Figure 2:
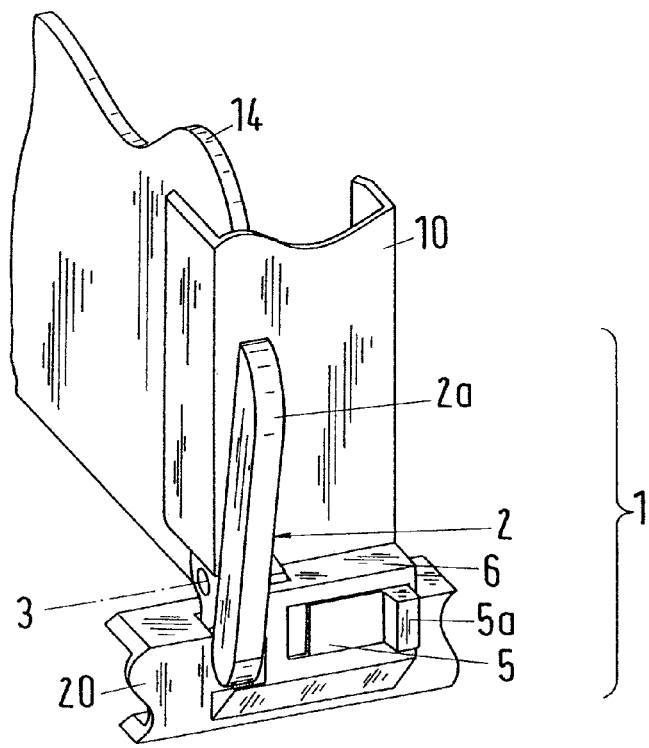
FIG. 2 shows the embodiment shown in FIG. 1 with the lever arm in an intermediate position.

FIG. 2 shows the embodiment described in FIG. 1 with the lever arm in an intermediate position. The reference numbers for the individual components have been retained, so that only the differences relative to FIG. 1 will be described in the following. In FIG. 2 the lever arm 2 of the apparatus 1 for the insertion and withdrawal of the plug-in module is unlocked and outwardly pivoted into an intermediate position, for example by an angle of from 5° to 20°, preferably from 8° to 15° in relation to the inwardly pivoted state. In the illustrated intermediate position the handle portion 2a of the lever arm can easily be grasped, so that it can subsequently be further outwardly pivoted by hand. The unlocked state can be recognized by the position of the operating element 5a, which is slid to the right in the embodiment shown in FIG. 2. Additionally, the locking element 5 can be designed with two colors, so that the second color is only visible if it is engaged and/or unlocked. In a preferred variation, the lever arm 2 is biased, for example by means of a return spring, so that the lever arm automatically pivots into the intermediate position after the unlocking.

Figure 3C:
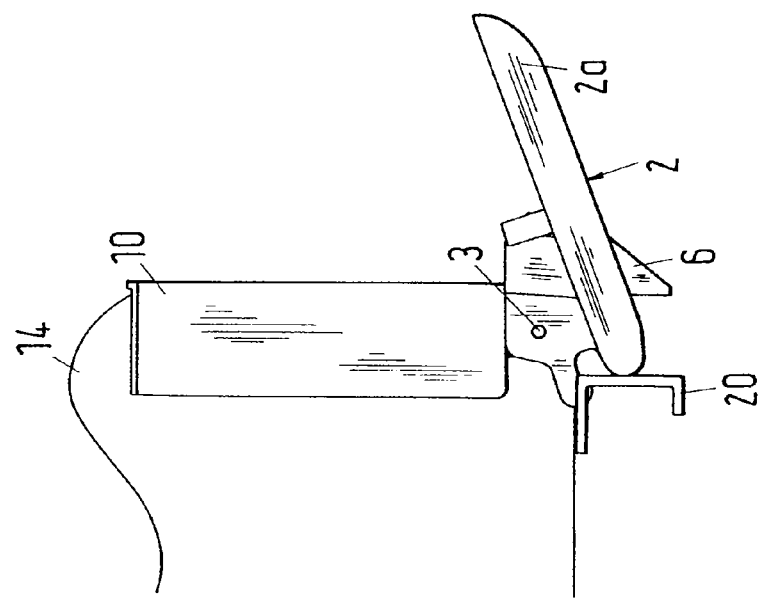
FIG. 3c is a side view of the embodiment with the lever arm in an outwardly pivoted position.
Figure 3B:
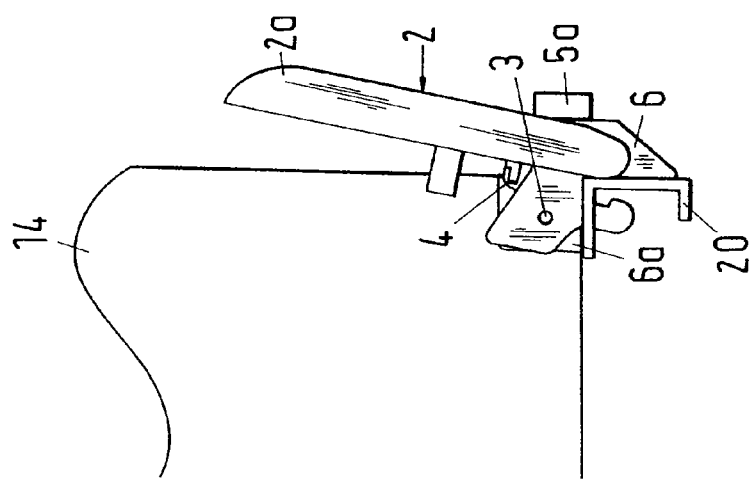
FIG. 3b is a side view of the embodiment with the lever arm in an intermediate position.
Figure 3A:
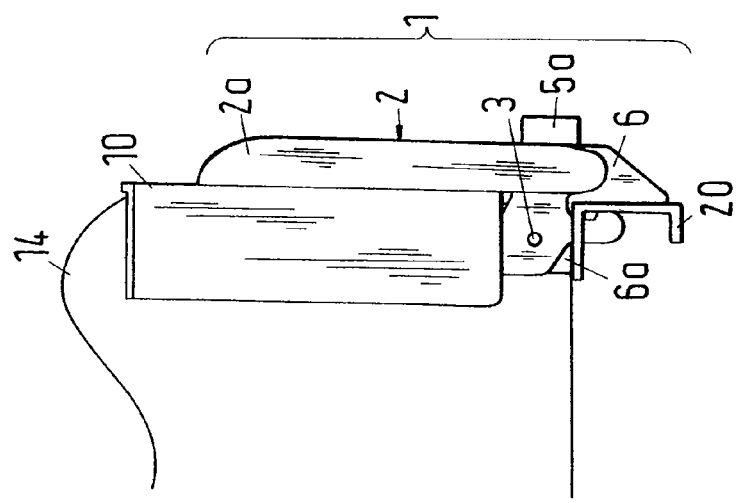
FIG. 3a is a side view of the embodiment with the lever arm in an inwardly pivoted position.

FIGS. 3a-c show side views of an embodiment of an apparatus for the insertion and withdrawal of a plug-in module according to the present invention with a lever arm 2 in three different positions as well as sections from the associated plug-in modules. The plug-in modules shown in FIG. 3a include an apparatus 1 for insertion and withdrawal of the same, a front section 10, referred to simply as a front panel in the following, and a circuit board 14. The lever arm 2 of the apparatus is provided with a handle portion 2a, by means of which the lever arm can be pivoted about an axis 3. In FIG. 3a, the lever arm is shown in an inwardly pivoted state, wherein the handle portion 2a contacts the front panel 10. The handle portion can also have forms other than the one shown, wherein the handle portion is purposely formed so that grasping it is made more difficult in the inwardly pivoted state of the lever arm, and/or that the introduction of a finger between the handle portion and front panel is made difficult or prevented by the lying of the handle portion on the front panel.

In the embodiment shown, the apparatus further includes a locking element, which is not visible in FIG. 3a, in order to lock and/or secure the lever arm, and an operating element 5a for the unlocking of the lever arm as well as a holding part 6 for the holding of the locking element. FIG. 3a further shows a front section 20 of a module carrier, into which the plug-in module is set. The apparatus 1 for the insertion and withdrawal of the plug-in module is arranged in the lower part of the front panel 10 of the plug-in module, such that the front section 20 of the module carrier engages into a recess of the lever arm in the inwardly pivoted state of the associated lever arm 2, so that the plug-in module cannot be withdrawn without outward pivoting of the same. The lever arm is locked in the inwardly pivoted state by means of the locking element, whereby the plug-in module is secured against unintentional withdrawal or loosening.

In an advantageous variant, the holding part 6 includes a protruding operating element 6a in the direction of the circuit board 14, in order to attach the holding part to the circuit board. The axis 3, about which the lever arm 2 is pivotable, is formed advantageously as a fastener element, for example as a screw, precision dowel screw, bolt or rivet, by which means the operating element 6a can be attached to the circuit board 14.

In the section of the plug-in module shown in FIG. 3b, the front panel of the same has been omitted to make the entire lever arm visible. The lever arm is shown in FIG. 3b in an intermediate position, in which it is pivoted outwardly after unlocking, for example by an angle from 5° to 20°, advantageously 8° to 15°. In an advantageous variant, the lever arm 2 is pre-stressed, for example by means of a return spring 4, so that the lever arm is automatically pivoted into the intermediate position after unlocking. In the intermediate position shown, the end of the lever arm opposite to the handle part is supported on a front section 20 of a plug-in module, whereas the handle portion 2a of the lever arm can now be comfortably grasped and subsequently pivoted further outwardly, wherein the plug-in modules are pulled out of the module carrier and the connection plugs are separated on the rear side of the plug-in module.

In FIG. 3c the lever arm 2 is shown in an outwardly pivoted state. The plug connections on the rear side of the plug-in module are now separated, so that they can be pulled out of the module carrier without any supporting means. Vice-versa, during the manual insertion, the plug-in module is brought into the position shown in FIG. 3c and slid fully into the module carrier by pivoting of the lever arm 2, with a recess of the lever arm being supported on the front section 20 of the module carrier, in order to overcome the insertion forces of the plug connections on the rear side of the plug-in module.

An exemplary embodiment of the method according to the invention for the insertion and withdrawal of a plug-in module with a front panel into and out of a module carrier respectively will be explained with reference to FIGS. 3a-c. The insertion and withdrawal of the plug-in module is conducted in the embodiment by means of an apparatus including a pivotable lever arm 2 with a lock. For the withdrawal of the plug-in module, the inwardly pivoted and locked lever arm 2, e.g. a lever arm as shown in FIG. 3a, is unlocked by means of an operating element 5a, which, as shown for example in FIG. 1, is arranged spaced from the lever arm and the unlocked lever arm is outwardly pivoted into an intermediate position and is in particular automatically pivoted into an intermediate position. A possible intermediate position is shown in FIG. 3b. Subsequently, the lever arm is pivoted further outward by means of a handle portion 2a of the same, whereby the plug-in module is withdrawn. FIG. 3c shows a possible example of a lever arm in an outwardly pivoted state. For the insertion of the plug-in module, the lever arm is inwardly pivoted with the handle portion 2a until the handle portion contacts the front panel 10, and the inwardly pivoted lever arm is automatically locked.

In a preferred embodiment of the method, the introduction of a finger between handle portion and front panel is made difficult or prevented through the design of the handle portion and/or the contact of the handle portion at the front panel.

In a further preferred embodiment of the method, a switching element 7 for active/passive switching of the plug-in module is actuated by the locking and/or the unlocking of the lever arm 2.

A separation of the unlocking procedure from the pull-out procedure is achieved due to the design of the handle portion of the lever arm in the apparatus for the insertion and withdrawal of a plug-in module with front panel, which contacts the front panel of the plug-in module in the inwardly pivoted state or is countersunk in it and/or in the spaced arrangement of the operating element for unlocking. In this way, possible damage to the locking element of the lever arm is prevented, as can happen if the unlocking procedure merges into the withdrawal procedure without separation. In addition, it is advantageous that if the active/passive switching or switching of the plug-in module to a current-free state is coupled to the unlocking procedure, the minimal time between the operation of the switching element during the unlocking and the separation of the rear side plug connections on withdrawal of the plug-in module can then be extended.

The invention claimed is:

1. A method for the insertion and withdrawal of a plug-in module with a front panel into and out of a module carrier respectively, the method comprising:

providing an apparatus, comprising:
  a pivotable lever arm comprising a handle portion;
  a locking element for locking the lever arm in an inwardly pivoted position; and
  an operating element for manually unlocking the lever arm, wherein the operating element is spaced apart from the lever arm so that the simultaneous operation of the operating element and the lever arm with a single hand is impeded;
withdrawing the plug-in module by:
  manually unlocking the lever arm by means of the operating element; and
  subsequently manually outwardly pivoting the lever arm by means of the handle portion; and
inserting the plug-in module by inwardly pivoting the lever arm with the handle portion, until the handle portion contacts the front panel such that the lever arm is automatically locked by the locking element.

2. A method according to claim 1, wherein the introduction of a finger between the handle portion and the front panel is made more difficult through at least one of the configuration of the handle portion and the contact of the handle portion at the front panel.

3. A method according to claim 1, further comprising operating a switching element for the active/passive switching of the plug-in module during unlocking and/or locking of the lever arm.

4. A method according to claim 1, further including automatically pivoting the unlocked lever arm outwardly into an intermediate position.

5. A method for the insertion and withdrawal of a plug-in module with a front panel into and out of a module carrier by means of an apparatus having a pivotable lever arm with a handle for manually moving the lever arm, the method comprising:
  providing a locking element that releasably locks the lever arm in a rest position of the lever arm,
  providing an operating element that unlocks the lever arm, at a location that is spaced apart from the lever arm, the location being such that the operating element and the lever arm cannot easily be simultaneously operated with a single hand,
  manually deactivating the operating element by moving the operating element from a locking position of the operating element, in which the locking element locks the lever arm in the rest position of the lever arm, to a release position of the operating element, in which the lever arm is free to be moved, and
  withdrawing the plug-in module by moving the lever arm from the rest position of the lever arm to a release position of the lever arm, while the operating element is deactivated.

6. A method according to claim 5, further including locking the lever arm in the rest position of the lever arm, comprising moving the lever arm to the rest position of the lever arm, such that the locking element locks the lever arm in the rest position of the lever arm.

7. A method according to claim 1 wherein unlocking the lever arm by means of the operating element comprises using a first hand, and outwardly pivoting the lever arm by means of the handle portion comprises using a second hand.

8. A method according to claim 5 wherein manually deactivating the operating element by moving the operating element from the locking position of the operating element to the release position of the operating element comprises using a first hand, and moving the lever arm from the rest position of the lever arm to the release position of the lever arm comprises using a second hand.

9. A method according to claim 1, wherein the locking element and the operating element are physically connected to one another.

10. A method according to claim 1, wherein the locking element and the operating element are integral to one another.

11. A method according to claim 5, wherein the locking element and the operating element are physically connected to one another.

12. A method according to claim 5, wherein the locking element and the operating element are integral to one another.

* * * * *